United States Patent
Sugahara

(10) Patent No.: US 7,537,320 B2
(45) Date of Patent: May 26, 2009

(54) PIEZOELECTRIC ACTUATOR AND LIQUID TRANSPORTING APPARATUS

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 485 days.

(21) Appl. No.: 11/356,195

(22) Filed: Feb. 17, 2006

(65) Prior Publication Data

US 2006/0181582 A1      Aug. 17, 2006

(30) Foreign Application Priority Data

Feb. 17, 2005      (JP) ............................. 2005-040174

(51) Int. Cl.
 *B41J 2/045* (2006.01)
(52) U.S. Cl. ............................. 347/70; 347/71; 347/72
(58) Field of Classification Search .................. 347/70, 347/68, 71, 72, 69
See application file for complete search history.

(56) References Cited

U.S. PATENT DOCUMENTS 5,764,255 A * 6/1998 Tsurui et al. .................. 347/70
6,637,869 B2 * 10/2003 Seto ............................. 347/70

FOREIGN PATENT DOCUMENTS

| EP | 0919383 | A2 |   | 6/1999 |
| EP | 919383 | A2 | * | 6/1999 |
| JP | 09277529 | A | * | 10/1997 |
| JP | H09-277529 | A |   | 10/1997 |
| JP | 11 334087 |   |   | 12/1999 |
| JP | 2004-066652 | A |   | 3/2004 |
| JP | 2004066652 | A | * | 3/2004 |

OTHER PUBLICATIONS

European Patent Office, European Search Report for Related Application No. EP 06003022, dated Jul. 11, 2007.

* cited by examiner

*Primary Examiner*—Stephen D Meier
*Assistant Examiner*—Rene Garcia, Jr.
(74) *Attorney, Agent, or Firm*—Baker Botts L.L.P.

(57) ABSTRACT

A piezoelectric actuator 3 of a liquid transporting apparatus includes grooves 40 which are formed on a surface of a vibration plate 30 on a side of pressure chambers 14, and each of the grooves 40 is formed at an area which is inside of the edge of one of the pressure chambers and which is outside of an area overlapping with one of individual electrodes 32. With the grooves 40, it is possible to partially reduce the rigidity of the vibration plate 30 at portions each of which surrounding one of the individual electrodes 32 (driving portions 31*a*), thereby improving the driving efficiency of the piezoelectric actuator 3 and to reduce the crosstalk between adjacent pressure chambers 14.

10 Claims, 15 Drawing Sheets

→ SCANNING DIRECTION

↙ PAPER FEEDING DIRECTION

SCANNING DIRECTION

PAPER FEEDING DIRECTION

PIEZOELECTRIC ACTUATOR AND LIQUID TRANSPORTING APPARATUS

FIELD OF THE INVENTION

The present invention relates to a piezoelectric actuator and a liquid transporting apparatus which transports liquid by applying pressure to the liquid.

BACKGROUND OF THE INVENTION

A liquid transporting apparatus such as an ink-jet head, which discharges ink through its nozzles, includes a channel unit and a piezoelectric actuator. The channel unit has liquid channels formed therein. The piezoelectric actuator applies transport energy on the liquid in the channel unit. For example, FIG. 3 of Japanese Patent Application Laid-open No. 11-334087 shows an ink-jet head including a channel unit (substrate), which has a plurality of pressure chambers (pressurizing chambers) formed therein. The pressure chambers communicate with a manifold (common passage), and each of the pressure chambers communicates with a nozzle. The piezoelectric actuator is a so-called unimorph-type piezoelectric actuator, which includes a metallic vibration plate, a piezoelectric layer and upper electrodes (individual electrodes). The vibration plate is formed to cover the pressure chambers in the channel unit. The piezoelectric layer is formed on the surface of the vibration plate and made of lead zirconate titanate (PZT) or the like. The upper electrodes are formed on the surface of the piezoelectric layer, each of the upper electrodes corresponding to one of the pressure chambers.

When driving voltage is applied selectively to the upper electrodes on the piezoelectric actuator, an electric field acts through portions (driving portions) of the piezoelectric layer sandwiched between the vibration plate and the upper electrodes applied with the driving voltage. The electric field expands or contracts the driving portions in the thickness direction of the piezoelectric layer, thereby deforming the driving portions. The deformation bends areas of the vibration plate, the areas facing pressure chambers corresponding to the deformed driving portions respectively, to apply pressure to the ink in the pressure chambers.

However, in the piezoelectric actuator described in the Japanese Application Laid-open No. 11-334087, if the rigidity of the vibration plate is high at areas (in particular, areas around the driving portions) of the vibration plate which cover the pressure chambers, the deformation of the whole region of the vibration plate facing the pressure chambers is impeded. In this case, in order to apply a predetermined pressure to the ink in the pressure chambers, it is necessary to apply a high voltage to the individual electrodes, resulting in the piezoelectric actuator consuming a large amount of electric power. If the areas of the vibration plate which surround the driving portions of the piezoelectric layer are high in rigidity, there arises a phenomenon of so-called "cross talk" in which the deformation of the portion of the piezoelectric layer and vibration plate which faces one of the pressure chambers propagates to another portion of the piezoelectric layer and vibration plate which faces other pressure chamber adjacent to the pressure chamber. In this case, the driving pattern for the plurality of pressure chambers (the pattern of voltage application to the plurality of individual electrodes) causes the variation in the amount of displacement of the portions of the vibration plate which cover the pressure chambers. The variation in the amount of displacement results in the variation in the ink discharge characteristics such as droplet velocity, droplet volume and other and the like, thereby lowering the printing quality.

SUMMARY OF THE INVENTION

An object of the present invention is to provide a piezoelectric actuator which is improved in driving efficiency and suppresses crosstalk, and to provide a liquid transporting apparatus in which both of a piezoelectric actuator improved in driving efficiency and the suppression of crosstalk can be realized.

According to a first aspect of the present invention, there is provided a piezoelectric actuator including a vibration plate; a piezoelectric layer arranged on a side of one surface of the vibration plate; a plurality of individual electrodes arranged on one surface of the piezoelectric layer; a common electrode arranged on the other surface of the piezoelectric layer opposite to the surface in which the individual electrodes are arranged; wherein grooves are formed on a surface of the vibration plate opposite to the piezoelectric layer, each of the grooves being formed outside an area in which one of the individual electrodes overlaps with the common electrode as viewed in a direction perpendicular to the surface of the vibration plate.

According to the piezoelectric actuator of the present invention, the grooves are formed on one surface of the vibration plate, each of the grooves being formed at an area outside of the area of the vibration plate which overlaps both of one of the individual electrodes and the common electrode (area outside of a driving portion of the piezoelectric layer). With these grooves, it is possible to partially lower the rigidity of the vibration plate, thereby reducing the crosstalk when applying voltage to one or more of the desired individual electrodes. In addition, it is possible to reduce the power consumption necessary for driving the piezoelectric actuator.

In the piezoelectric actuator of the present invention, the vibration plate may be the common electrode. In this case, the piezoelectric layer can be deformed with smaller force in comparison with a case where a common electrode is provided separately from the vibration plate. Consequently, this further reduces the power consumption necessary for driving the piezoelectric actuator.

According to a second aspect of the present invention, there is provided a liquid transporting apparatus including a channel unit having a plurality of pressure chambers arranged along a plane; and a piezoelectric actuator which is arranged on one surface of the channel unit and which changes volume of the pressure chambers to apply pressure to liquid in the pressure chambers; wherein the piezoelectric actuator includes a vibration plate which covers the pressure chambers, a piezoelectric layer arranged on a side of the vibration plate opposite to the pressure chambers, a plurality of individual electrodes each of which is arranged at an area overlapping with a central portion of one of the pressure chambers as viewed in a direction perpendicular to the plane, and a common electrode which sandwiches the piezoelectric layer between the individual electrodes and the common electrode; and wherein grooves are formed on a surface of the vibration plate on a side of the pressure chambers, each of the grooves being formed at an area which is outside of an area which overlaps with both of one of the individual electrodes and the common electrode as viewed in the direction perpendicular to the plane.

In the liquid transporting apparatus of the present invention, each of the grooves may be disposed inside of an edge of one of the pressure chambers and may be formed along the edge of one of the pressure chambers as viewed in the direction perpendicular to the plane.

In the liquid transporting apparatus of the present invention, when driving voltage is applied to a certain individual electrode of the individual electrodes, an electric field is generated through the portion (driving portion) of the piezoelectric layer which is located between this individual electrode and the common electrode. The electric field is parallel with a thickness direction which is equal to the direction of polarization of the piezoelectric layer. Then, the electric field expands the driving portion in the thickness direction and contracts the driving portion in a direction parallel to the plane. Accompanying the deformation of the driving portion, the vibration plate also deforms. The deformation of the vibration plate causes a change in the volume of a pressure chamber corresponding to this individual electrode, thereby applying pressure to the ink in the pressure chamber.

As stated above, grooves such as grooves each extending along the edge of one of the pressure chambers, are formed on the surface of the vibration plate on a side of the pressure chambers, each of the grooves being formed at an area which is outside of another area which overlaps with both of one of the individual electrodes and the common electrode (area outside of the driving portion). Accordingly, the rigidity of the vibration plate is lowered, than the other portion of the vibration plate, at the areas each surrounding one of the driving portions of the piezoelectric layer. Consequently, when each of the grooves is disposed inside of the edge of one of the pressure chambers, for example, the vibration plate can be deformed more easily when the driving portions are deformed, thereby improving the driving efficiency of the piezoelectric actuator. Further, the rigidity of the vibration plate is lowered at the areas each located outside of one of the driving portions. Accordingly, when a portion of the piezoelectric layer facing one of the pressure chambers is deformed, the deformation of this portion hardly propagates to another portion of the piezoelectric layer and the vibration plate facing another pressure chamber adjacent to this pressure chamber, thereby suppressing the cross talk.

In the liquid transporting apparatus of the present invention, each of the grooves may have a circular shape, and wirings connected to the individual electrodes respectively may extend up to areas each of which is outside of one of the grooves, as viewed in the direction perpendicular to the plane, each of the wirings extending straddling one of the grooves. Since the grooves are formed on the surface of the vibration plate on the side of the pressure chambers, the other surface of the vibration plate (the surface opposite to the pressure chambers), which is not formed with the grooves, is flat. Accordingly, it is possible to position and extend the wirings freely. In other words, by forming the grooves in the vibration plate, it is possible to easily extend the wirings, connected to the individual electrodes respectively, up to the areas each of which is outside of one of the grooves (outside one of the pressure chambers), each of the wirings extending while straddling one of the grooves, without lowering the degree of freedom at which the wirings can be positioned on the surface of the vibration plate.

In the liquid transporting apparatus of the present invention, each of the grooves may be formed to have a shape of seamless or unbroken circle. In this case, the rigidity of the entire circular-shaped portion of the vibration plate, which extends along the edge of each of the pressure chambers, is lowered. Accordingly, the vibration plate can be deformed more easily, thereby further improving the driving efficiency of the piezoelectric actuator.

In the liquid transporting apparatus of the present invention, the vibration plate may have a first metallic material layer and a second metallic material layer which are formed of mutually different metallic materials and are stacked in a laminated state; the second metallic material layer may be arranged in the channel unit to cover the pressure chambers; and through holes may be formed in a surface of the second metallic material layer, the surface being on a side of the pressure chambers, each of the through holes extending along the edge of one of the pressure chambers and being formed to have the shape of seamless or unbroken circle, and each of the through holes of the second metallic layer material may be closed by the first metallic material layer to form each of the grooves.

The through holes are formed by performing the following procedure. That is, in a state two metallic material layers formed of mutually different metallic materials are stacked in a laminated state, only the second metallic material layer is subject to the etching (selective etching) to form the through holes in the second metallic material layer, then the through holes are closed by the first metallic material layer to become the grooves. This makes it easy to form the grooves precise in depth as compared with a case where grooves having a predetermined depth are formed by half etching in a vibration plate made of one metallic material.

In the liquid transporting apparatus of the present invention, the second metallic material layer may be formed of a metallic material etchable by a predetermined etching solution; and the first metallic material layer may be formed of a metallic material unetchable by the predetermined etching solution. In this case, the first metallic material layer is not etched when the through holes are formed in the second metallic material layer by means of etching. Accordingly, it is possible to form the through holes only in the second metallic material layer without adjusting the other etching conditions such as the etching speed or the like.

In the liquid transporting apparatus of the present invention, each of the grooves may be formed to be deeper toward the edge of one of the pressure chambers. In this case, the vibration plate is thinnest at the vicinity of its portions joined to the channel unit. Accordingly, the vibration plate can be deformed more easily, thereby improving the driving efficiency of the piezoelectric actuator.

In the liquid transporting apparatus of the present invention, each of the grooves may have a cross section which is tapered to be wider toward one of the pressure chambers. In this case, the angle at the corner of each of the grooves is greater than 90 degrees. This prevents air bubbles from remaining in the corner of each groove.

In the liquid transporting apparatus of the present invention, the channel unit may have a common liquid chamber communicating with the pressure chambers; a throttle passage may be formed between the one surface of the channel unit and a portion of one of the grooves formed on the vibration plate, a sectional area of the throttle passage being partially narrowed between the common liquid chamber and one of the pressure chambers. The throttle passage, provided between the common liquid chamber and each of the pressure chambers, throttles the passage between the common liquid chamber and each of the pressure chambers so that the pressure waves generated in each of the pressure chambers is hardly propagated to the common liquid chamber. Since the sectional area of the throttle passage strongly influences the propagation of pressure waves in the pressure chamber and, as a result, the amount of transported liquid, it is necessary to form the throttle passage with precision. Here, the throttle passage is formed between the one surface of the channel unit and the portion of one of the grooves. Accordingly, the formation of the grooves in the vibration plate results in throttle passages being formed simultaneously with the formation of the grooves. This simplifies the manufacturing process and improves the manufacturing yield in comparison with a case where throttle passages, which need to be formed with precision, are formed separately from grooves by a process such as half etching.

In the liquid transporting apparatus of the present invention, the channel unit may be formed of a plurality of laminated plates in which a channel including the pressure chambers are formed; one of the plates may be formed with the pressure chambers, a plurality of through holes which are to be at least a part of channels each of which communicates the common liquid chamber and one of the pressure chambers, and partition walls each of which partitions one of the pressure chambers and one of the through holes; a surface of each of the partition walls may face the portion of one of the grooves to form the throttle passage therebetween, the surface being on a side of the vibration plate; and a side surface of each of the partition walls, the side surface facing one of the pressure chambers, may be inclined at an angle exceeding 90 degrees with respect to a surface of one of the pressure chambers facing the vibration plate. This enables liquid to be smoothly introduced from each of the throttle passages into one of the pressure chambers smoothly, and any air babbles hardly remain at the corner formed by the surface of each of the pressure chambers facing the vibration plate and the side surface of each of the partition walls. Consequently, the liquid transporting apparatus can transport liquid more stably.

DETAILED DESCRIPTION OF PREFERRED EMBODIMENTS

A first embodiment of the present invention will be described. The first embodiment is an example in which the present invention is applied to an ink-jet head, as a liquid transporting apparatus, which discharges ink through its nozzles onto recording paper.

Figure 1:
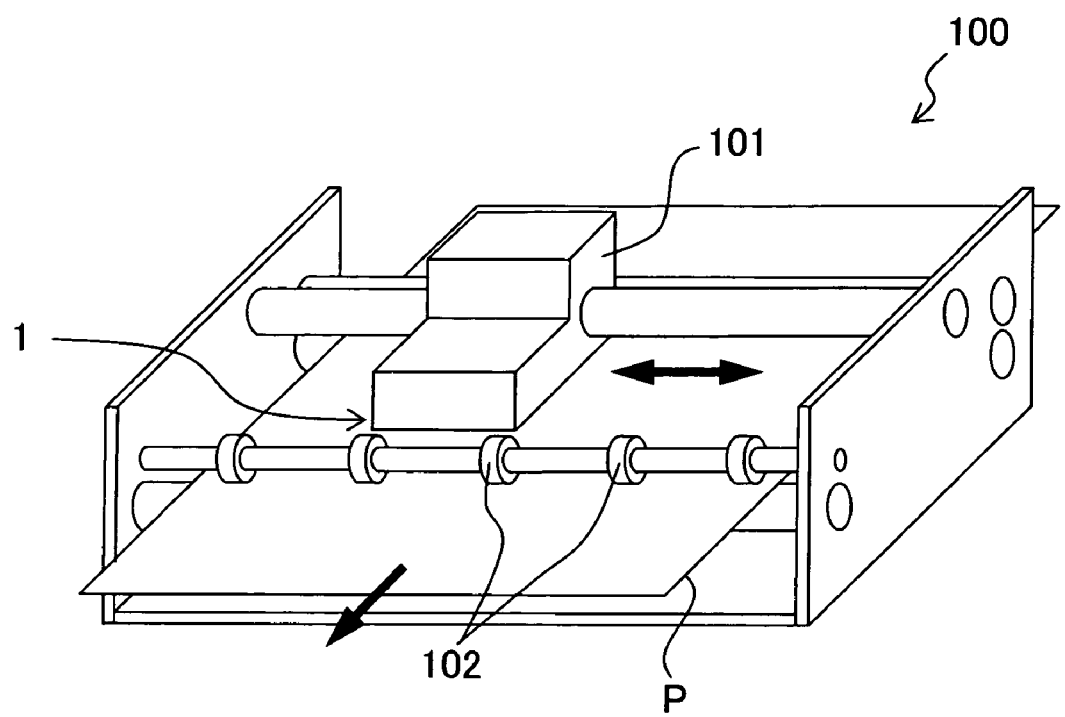
FIG. 1 is a schematic perspective view of an ink-jet printer according to a first embodiment of the present invention.

First, an ink-jet printer 100 provided with an ink-jet head 1 will be described briefly. As shown in FIG. 1, the ink-jet printer 100 is provided with a carriage 101, a serial ink-jet head 1, feed rollers 102, etc. The carriage 101 is movable in right and left directions in FIG. 1 and carries the ink-jet head 1 which discharges ink onto recording paper P. The feed rollers 102 convey recording paper P forward in FIG. 1. The ink-jet head 1 moves integrally with the carriage 101 in right and left directions (in the scanning directions). The ink-jet head 1 has nozzles 20 (see FIGS. 6 to 8) formed through its ink discharge surface on its lower surface and ejects ink through the ejection ports of the nozzles 20 onto recording paper P. Recording paper P on which an image or the like has been recorded by the ink-jet head 1 is discharged forward (in the paper feeding direction) by the feed rollers 102.

Next, the ink-jet head 1 will be described in detail with reference to FIGS. 2 to 5.

As shown in FIGS. 2 to 5, the ink-jet head 1 includes a channel unit 2 and a piezoelectric actuator 3 which is arranged on the upper surface of the channel unit 2. The channel unit 2 has individual ink channels 21 (see FIG. 4) formed therein, and each of the individual ink channels 21 includes a pressure chamber 14.

Figure 4:
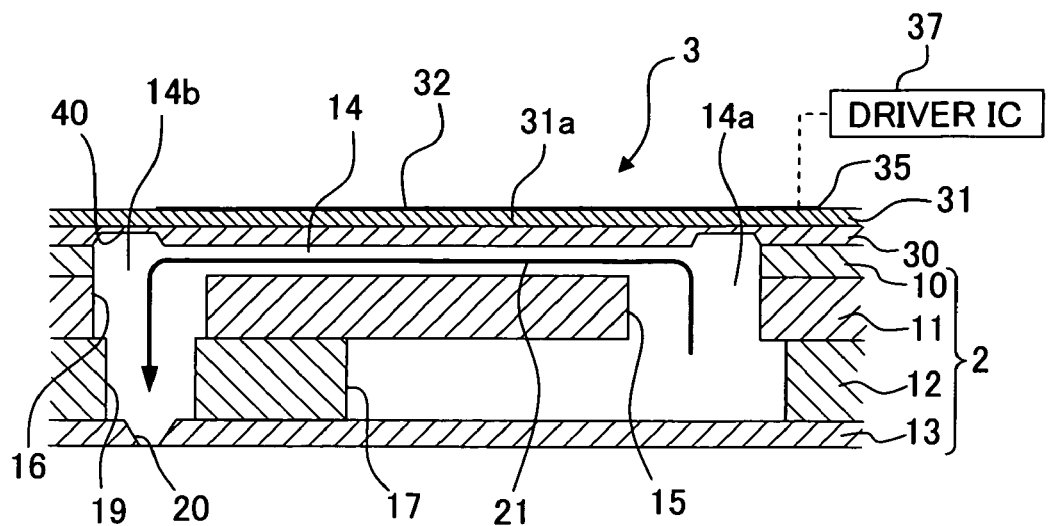
FIG. 4 is a sectional view taken on line IV-IV in FIG. 3.
Figure 5:
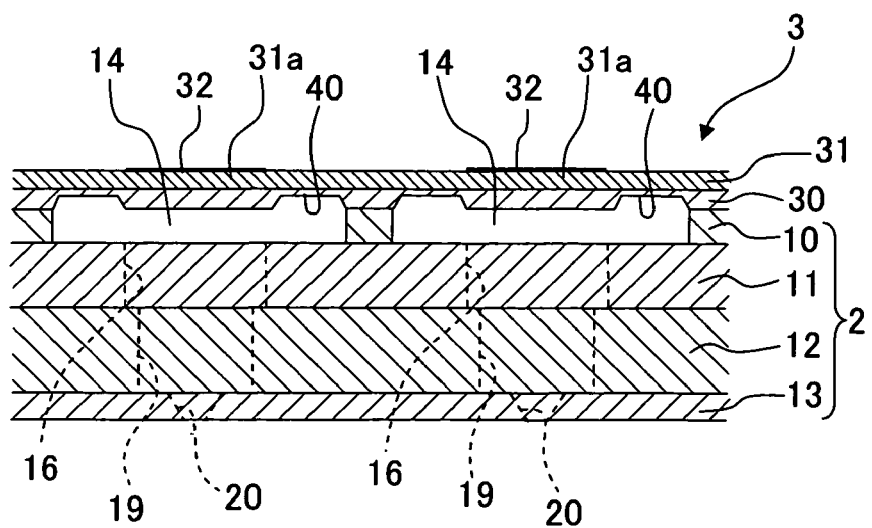
FIG. 5 is a sectional view taken on line V-V in FIG. 3.

First, the channel unit 2 will be described. As shown in FIGS. 4 and 5, the channel unit 2 includes a cavity plate 10, a base plate 11, a manifold plate 12 and a nozzle plate 13, and these four plates 10 to 13 are joined together in the form of a laminate. Among these plates, the cavity plate 10, base plate 11 and manifold plate 12 are made of stainless steel. Ink channels such as a manifold 17 and pressure chambers 14, which will be described later on, can be easily formed through the three plates 10 to 12 by etching. The nozzle plate 13 may be formed of high-molecular synthetic resin material such as polyimide and is bonded to the lower surface of the manifold plate 12. Alternatively, the nozzle plate 13 may be formed of a metallic material such as stainless steel, similar to the three plates 10 to 12.

Figure 2:
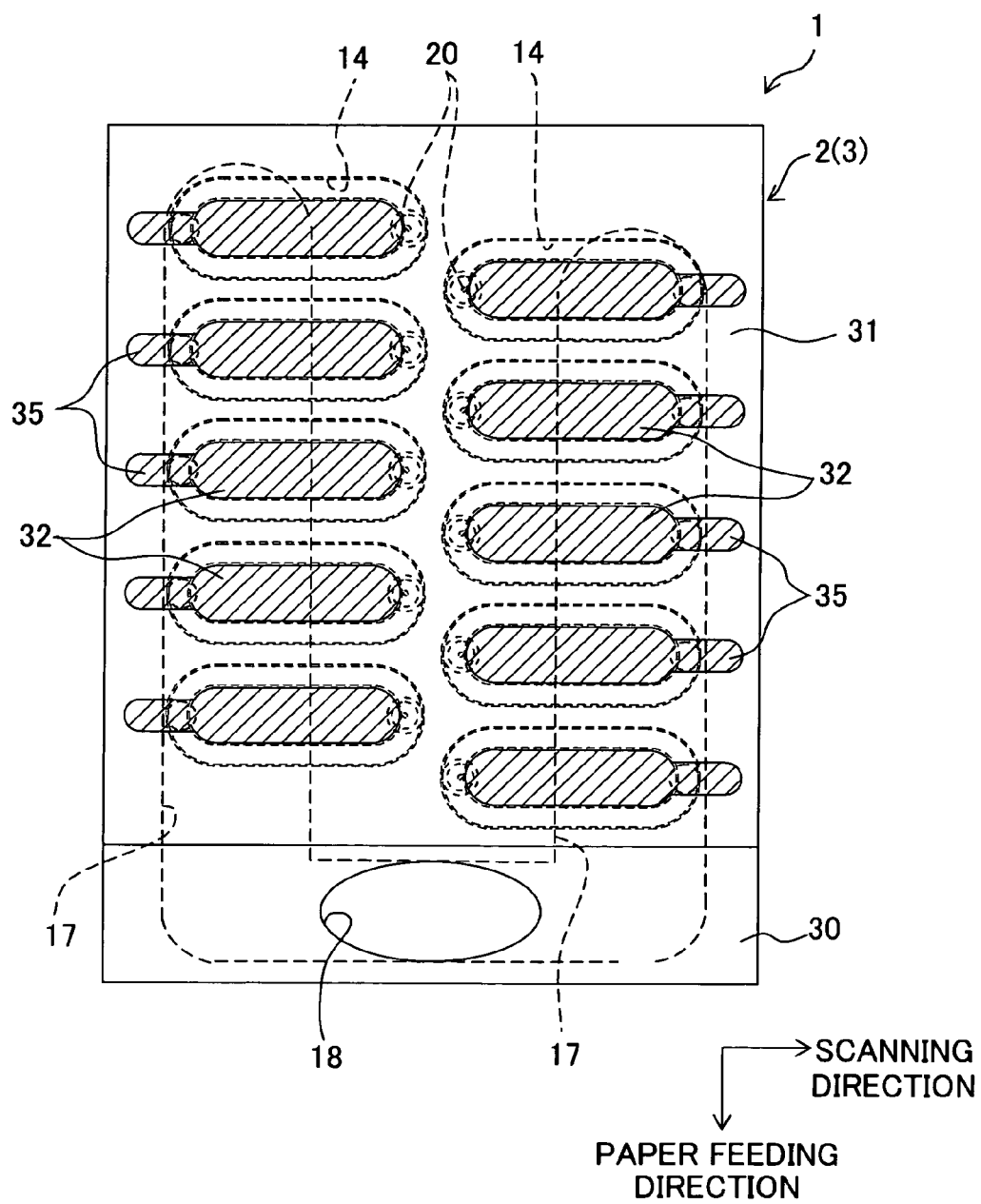
FIG. 2 is a plan view of the ink-jet head shown in FIG. 1.
Figure 3:
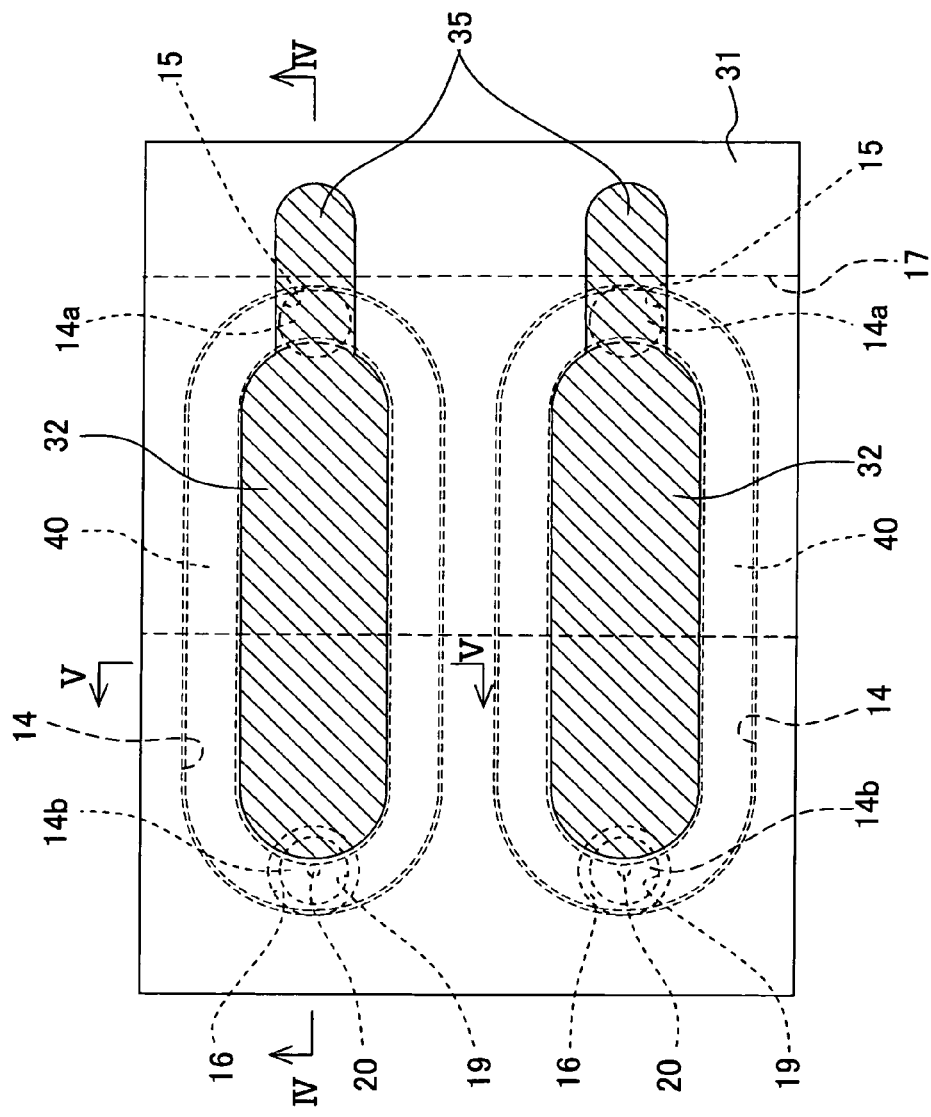
FIG. 3 is a partially enlarged view of FIG. 2.

As shown in FIGS. 2 to 5, the cavity plate 10 has a plurality of pressure chambers 14 formed therein and arranged along a plane. The pressure chambers 14 are open toward a vibration plate 30 (upward in FIGS. 4 and 5) which will be described later on. The pressure chambers 14 are arrayed in two rows extending in the paper feeding direction (up and down direction in FIG. 2). In plan view, the pressure chambers 14 are formed to have a roughly elliptic which is long in the scanning directions (right and left direction in FIG. 2). As shown in FIGS. 3 and 4, each of the pressure chambers 14 has an ink inlet port 14a and an ink outlet port 14b formed to have a circular shape and arranged at both ends respectively in the longitudinal direction of each of the pressure chambers 14.

As shown in FIGS. 3 and 4, communication holes 15, 16 are formed in the base plate 11. Each of the communication holes 15 is formed at a position overlapping with the ink inlet port 14a of one of the pressure chambers 14, and each of the communication holes 16 is formed at a position overlapping with the ink outlet port 14b of one of the pressure chambers 14. A manifold 17, which extends in the paper feed direction (up and down direction in FIG. 2), is formed in the manifold plate 12. As shown in FIGS. 2 to 4, the manifold 17 is formed so as to overlap in plan view with the left halves of the pressure chambers 14 arrayed on the left side of the cavity plate 10 and the right halves of the chambers 14 arrayed on the right side of the cavity plate 10. The manifold 17 is connected to an ink supply port 18 formed in the vibration plate 30. The vibration plate 30 will be described later on. Ink is supplied from an ink tank (not shown) through the ink supply port 18 to the manifold 17. The manifold plate 12 also has a plurality of communication holes 19 formed therein. Each of the communication holes 19 communicates with one of the communication holes 16 and is formed at a position overlapping with an end portion of one of the pressure chambers 14, the end portion being opposite to the manifold 17. The nozzle plate 13 has a plurality of nozzles 20 formed therein. Each of the nozzles 20 is formed at a position overlapping in a plan view with one of the communication holes 19. The nozzles 20 can be formed, for example, by subjecting a substrate of high-molecular synthetic resin such as polyimide to excimer laser processing.

As shown in FIG. 4, the manifold 17 communicates with each of the ink inlet ports 14a of the pressure chambers 14 via the associated communication hole 15. As shown in FIG. 4, each of the ink outlet ports 14b of the pressure chambers 14 communicates with one of the nozzles 20 via the associated communication holes 16 and 19. Thus, individual ink channels 21 are formed in the channel unit 2, each of which extending from the manifold 17, via one of the pressure chambers 14, to one of the nozzles 20.

Next, the piezoelectric actuator 3 will be described below. As shown in FIGS. 2 to 5, the piezoelectric actuator 3 includes a vibration plate 30, a piezoelectric layer 31 and a plurality of individual electrodes 32. The vibration plate 30 is arranged on the upper surface of the channel unit 2. The piezoelectric layer 31 is formed on the upper surface (surface opposite to the pressure chambers 14) of the vibration plate 30. The individual electrodes 32 are formed on the upper surface of the piezoelectric layer 31, each of which corresponds to one of the pressure chambers 14.

The vibration plate 30 is roughly rectangular in plan view and formed of a metallic material including, for example, an iron alloy such as stainless steel, a copper alloy, a nickel alloy or a titanium alloy. The vibration plate 30 is arranged on and is joined to the upper surface of the cavity plate 10 so as to cover the pressure chambers 14. The metallic vibration plate 30 is electrically conductive and also serves as a common electrode which causes an electric field to act in a portion of the piezoelectric layer 31 sandwiched between each of the individual electrodes 32 and the vibration plate 30.

As shown in FIGS. 3 to 5, the vibration plate 30 has grooves 40 formed to have a seamless or unbroken circular shape on the lower surface (surface on a side of the pressure chambers 14) of the vibration plate 30. Each of the grooves 40 extends at substantially uniform width along the edge of one of the pressure chambers 14. Each of the grooves 40 extends, in a plan view (as viewed in a direction perpendicular to the plane in which the pressure chambers 14 are arranged), inside of the edge of one of the pressure chambers 14 and outside of the portion overlapping with one of the individual electrodes 32 (and the vibration plate 30 as the common electrode). The portions of the vibration plate 30, where the grooves 40 are formed, are thinner than the other portion of the vibration plate, so that the vibration plate 30 is partially low in rigidity. The grooves 40 can be formed by means of processing such as half etching or press working. As shown in FIGS. 4 and 5, each of the grooves 40 has a tapered cross section which is wider downward, namely toward one of the pressure chambers 14. Thus, the angle at the corner portion of each groove 40 is greater than 90 degrees. This prevents air bubbles from remaining at the corner portion of each of the grooves 40. This angle of corner portion can be a desired angle by adjusting the processing condition such as etching speed or the like. Because the grooves 40 are formed on the lower surface of the vibration plate 30, the upper surface of this plate is flat, without any concave or convex portions.

The piezoelectric layer 31 is arranged on the upper surface of the vibration plate 30 and is made mainly of lead zirconate titanate (PZT) which is a ferroelectric solid solution of lead zirconate and lead titanate. As shown in FIGS. 2 to 5, the piezoelectric layer 31 is formed on the flat surface of the vibration plate 30, continuously over the pressure chambers 14. The piezoelectric layer 31 can be formed, for example, by an aerosol deposition (AD) method, which is a method for blowing very small particles of piezoelectric material onto a substrate so that the particles impinge at a high velocity and are deposited on the substrate. Alternatively, the piezoelectric layer 31 can be formed by a sputtering method, a chemical vapor deposition (CVD) method, a sol-gel method or a hydrothermal synthesis method.

The individual electrodes 32 are one size smaller than the pressure chambers 14 and elliptic in plan view. Each of the individual electrodes 32 is formed on the upper surface of the piezoelectric layer 31, at a position overlapping with a central portion of one of the pressure chambers 14. The individual electrodes 32 are formed of electrically conductive material such as gold, copper, silver, palladium, platinum, titanium or the like. Wirings 35 are formed on the upper surface of the piezoelectric layer 31, each of which extending parallel to the longitudinal direction of one of the individual electrodes 32 (right and left directions in FIG. 2). Each of the wirings 35 extends from an end portion of one of the individual electrodes 32, the end portion being on a side of the manifold 17. The individual electrodes 32 and wirings 35 can be formed, for example, by screen printing, the sputtering method, the vapor deposition method or the like.

A flexible wiring member (not shown) such as flexible printed circuit (FPC) or the like is joined to the wirings 35. As shown in FIG. 4, the wirings 35 are connected electrically to a driver IC 37 via the wiring member. Driving voltage is supplied from the driver IC 37 selectively to the individual electrodes 32 via the wirings 35.

The areas of the vibration plate 30, each of which covers one of the pressure chambers 14, is not joined to the channel unit 2 (cavity plate 10), and is flexible. When each of the wirings 35 does not extend up to the area outside of one of the pressure chambers 14, it is not be possible to press the wiring member such as FPC sufficiently against each of the wirings 35 when connecting a terminal of the wiring member to each of the wirings 35 with solder or the like. Therefore, there is a possibility that the reliability of the electric connection is lowered between the wiring member and the wirings 35. In this embodiment, as shown in FIGS. 2 and 3, each of the wirings 35, connected to one of the individual electrodes 32, extends up to an area outside of one of the grooves 40 (area outside of one of the pressure chambers 14), at an area overlapping in a plan view with the ink inlet 14a (communication hole 15) of one of the pressure chambers 14, straddling over one of the circular grooves 40. In the areas, each of which is outside of one of the grooves 40, the vibration plate 30 is joined to the channel unit 2. This makes it possible to press the wiring member sufficiently against the wirings 35 respectively so that the wiring member and the wirings 35 can be connected reliably.

Next, the operation of the piezoelectric actuator 3 will be described. When driving voltage is applied from the driver IC 37 selectively to the individual electrodes 32, a potential difference is generated between one of the individual electrodes 32, which is on the upper surface of the piezoelectric layer 31 and to which the driving voltage is applied, and the vibration plate 30 as the common electrode which is on the lower surface of the piezoelectric layer 31 and is kept at ground potential. The potential difference generates a vertical electric field in a portion (driving portion 31a) of the piezoelectric layer 31 which is sandwiched between the individual electrode 32 and the vibration plate 30. The electric field contracts the driving portion 31a of the piezoelectric layer 31 horizontally (perpendicularly to the directions of polarization of the piezoelectric layer 31, which are vertical) Accompanied by the contraction of the driving portion 31a of the piezoelectric layer 31, the vibration plate 30 is deformed to project toward one of the pressure chambers 14. The deformation of the vibration plate 30 reduces the volume of the pressure chamber 14, thereby applying pressure to the ink in this pressure chamber. The applied pressure discharges an ink droplet through a nozzle 20 communicating with the pressure chamber 14.

As described above and shown in FIGS. 2 to 4, the grooves 40 are formed to have the seamless circular shape on the lower surface (surface on the side of the pressure chambers 14) of the vibration plate 30. Each of the grooves extends along the edge of one of the pressure chambers 14, and is formed at outside of the area overlapping with one of the individual electrodes 32 (and with the upper surface of the vibration plate 30 as the common electrode), namely outside of an area overlapping with one of the driving portions 31a, of the piezoelectric layer 31, which deform the vibration plate 30. Thus, the circular-shaped areas of the vibration plate 30, each of which surrounds one of the driving portions 31a, are thinner than the other area of the vibration plate 30. Because the flexural rigidity of a plate material is proportional to the cubed thickness of the plate material, the circular areas of the vibration plate 30, in which the grooves 40 are formed, are consequently lower in rigidity than the other area of the vibration plate 30 in which no grooves are formed. Accordingly, when the driving portions 31a of the piezoelectric layer 31 are deformed when the driving voltage is applied to the individual electrodes 32, the areas of the vibration plate 30, each of which surrounds one of the driving portions 31a, are deformed more easily. This makes it possible to lower the driving voltage applied to the individual electrodes 32, thereby improving the driving efficiency of the piezoelectric actuator 3. This also makes it possible to reduce the costs of electric devices such as the driver IC 37, which supplies the individual electrodes 32 with driving voltage, and the FPC. Each of the grooves 40 is formed in the seamless circular shape along the overall edge of one of the pressure chambers 14. This ensures that the circular portions of the vibration plate 30, each of which extends along the edge of one of the pressure chambers 14, are lower in rigidity reliably. The lower rigidity enables the vibration plate 30 to deform more easily, thereby further improving the driving efficiency of the piezoelectric actuator 3.

In general, in a piezoelectric actuator, such as the piezoelectric actuator 3 of the first embodiment in which the piezoelectric layer 31 is formed continuously over the pressure chambers 14, when a driving portion 31a of the piezoelectric layer 31 which faces one of the pressure chambers 14 is deformed, the phenomenon of so-called cross talk is particularly tend to occur in which this deformation of the driving portion 31a is propagated to a portion of the piezoelectric layer 31 and a portion of the vibration plate 30 which face another pressure chamber 14 adjacent to this pressure chamber 14. However, in the piezoelectric actuator 3 of this embodiment, as described above, the rigidity is lowered in the whole circular areas each of which is formed with one of the grooves 40 and surrounds one of the driving portions 31a. Accordingly, the deformation of a certain driving portion 31a facing a pressure chamber 14 is hardly propagated to another pressure chamber 14 adjacent to this pressure chamber 14, thereby suppressing the cross talk reliably.

In addition, since the grooves 40 are formed on a surface of the vibration plate 30 on the side of the pressure chambers 14, the upper surface of the vibration plate 30 is flat without any convex and concave portions. This makes any concave or convex portions hardly appear on the upper surface of the piezoelectric layer 31 when the piezoelectric layer 31 is formed on the upper surface of the vibration plate 30 by the method such as the AD method or the like. Accordingly, the wirings 35 can be positioned and extended freely on the upper surface of the piezoelectric layer 31 with little concave and convex portions. The formation of the grooves 40 in the vibration plate 30 does not lower the degree of freedom at which the wirings 35 can be positioned. This makes it easy to form the wirings 35, which are connected to the individual electrodes 32 respectively, so that each of the wirings 35 extends up to the area outside of one of the grooves 40, straddling over one of the grooves 40.

Next, modified embodiments in which various modifications are made to this embodiment will be described. Elements or components of the modified embodiments having the same configuration as those of the embodiment are given the same reference numerals and the descriptions therefor are omitted as appropriate.

First Modified Embodiment

Figure 6:
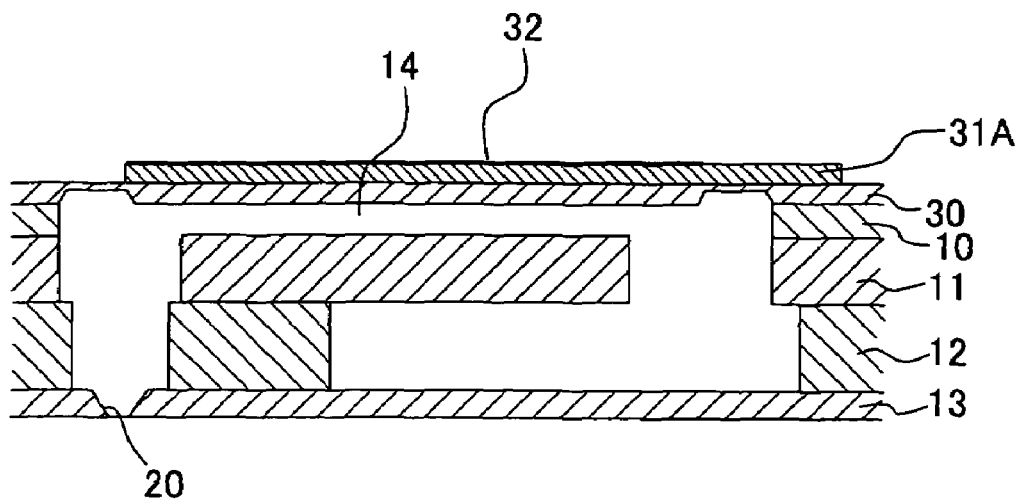
FIG. 6 is a diagram showing a first modified embodiment of the first embodiment corresponding to FIG. 4.
Figure 7:
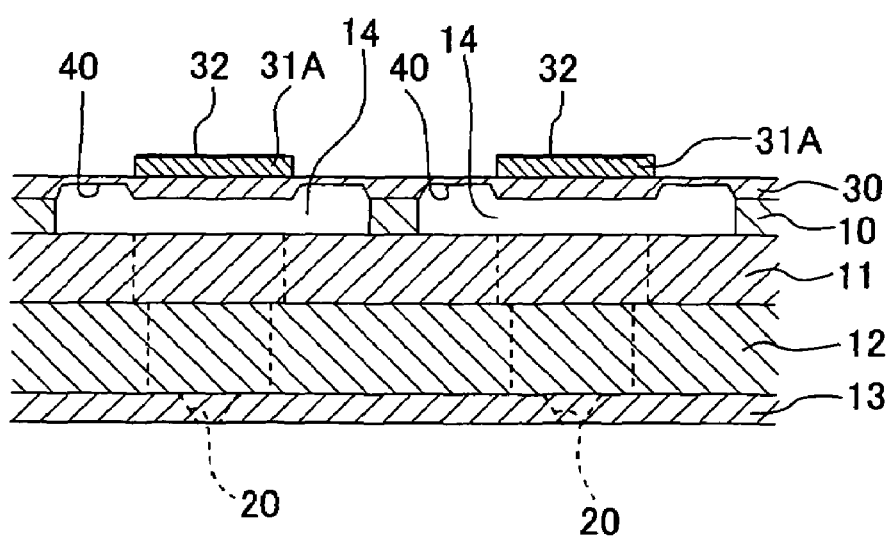
FIG. 7 is a diagram showing the first modified embodiment corresponding to FIG. 5.

It is not necessarily indispensable that a piezoelectric layer be formed on the upper surface of the vibration plate 30 continuously over the plurality of pressure chambers 14. In a first modified embodiment, as shown in FIGS. 6 and 7, a plurality of piezoelectric layers 31A may be formed on the upper surface of the vibration plate 30 at positions each of which overlaps with one of the pressure chambers 14.

Second Modified Embodiment

Figure 8:
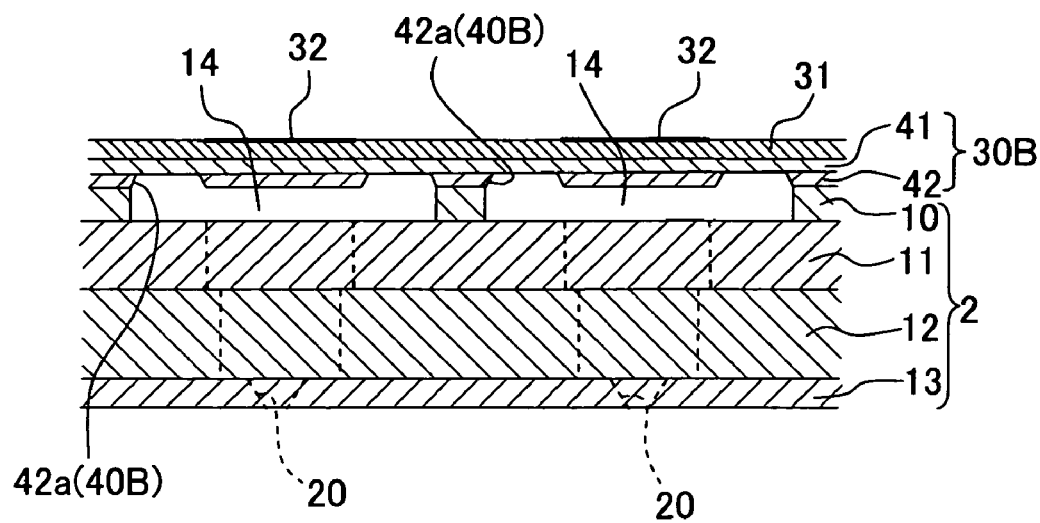
FIG. 8 is a diagram showing a second modified embodiment of the first embodiment corresponding to FIG. 5.

In a second modified embodiment, as shown in FIG. 8, a vibration plate 30B may be a clad material formed by laminating two metallic materials (a first metallic material layer 41 and a second metallic material layer 42) which are mutually different from each other. The second metallic material layer 42 is arranged on the channel unit 2 to cover the pressure chambers 14 which are formed through the cavity plate 10. The first metallic material layer 41 is arranged on the surface of the second metallic material layer 42. In the second metallic material layer 42, through holes 42a are formed to have a seamless circular shape. Each of the through holes 42a extends along the edge of one of the pressure chambers 14. The through holes 42a are covered with the first metallic material layer 41 so as to form grooves 40B respectively.

It is possible to form grooves 40B in the vibration plate 30B by forming the through holes 42a through the second metallic material layer 42 by subjecting the second metallic material layer 42a to the etching (full etching) in a state in which the metallic layers 41 and 42 are laminated on each other. In order to prevent the first metallic material layer 41 from being etched when the second metallic material layer 42 is etched, it is preferable that the first metallic material layer 41 be made of a metallic material which cannot be etched with the etching solution or liquid for the second metallic material layer 42. For example, the first metallic material layer 41 is formed of titanium, and the second metallic material layer 42 is formed of stainless steel or aluminum or the like. In this case, the second metallic material layer 42 is etched with an etching liquid of ferric chloride ($FeCl_3$) so that only the second metallic material layer, formed of stainless steel or aluminum or the like, is etched, but the first metallic material layer 41 is not etched, thereby forming the through holes 42a through the second metallic material layer 42. Alternatively, the first metallic material layer 41 is formed of stainless steel or aluminum or the like, and the second metallic layer 42 is formed of titanium. In this case, the second metallic material layer 42 is etched with an etching liquid of hydrofluoric acid (HF) so that only the second metallic material layer 42, formed of titanium, is etched, but the first metallic material layer 41 is not etched, thereby forming the through holes in the second metallic material layer 42.

In this embodiment, after the first and second metallic material layers 41 and 42 are joined together by means of metal diffusion bonding or the like, only the second metallic material layer 42 is subjected to etching (selective etching) so as to form the through holes 42a having the seamless circular shape. The through holes 42a are covered with the first metallic material layer 41 to form the grooves 40B. This makes it easy to form the grooves 40B which are more accurate in depth than the grooves 40, which are formed by half etching in the vibration plate 30 made of one metallic material, as in the above-described first embodiment. In other words, when the thickness of the second metallic layer 42 is set to be equal to the desired depth of the grooves 40B, it is possible to perform the etching without particularly adjusting the conditions such as etching speed, thereby simplifying the process for forming the grooves 40B.

Third Modified Embodiment

Figure 9:
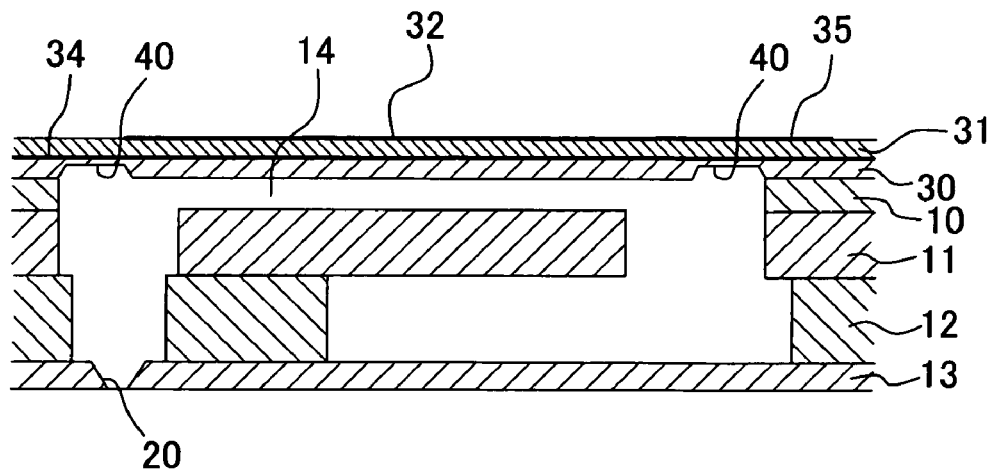
FIG. 9 is a diagram showing a third modified embodiment of the first embodiment corresponding to FIG. 4.

It is not necessarily indispensable that the vibration plate 30 should serve as the common electrode as is the case with the first embodiment. In a third modified embodiment, as shown in FIG. 9, a common electrode 34 may be provided separately from the vibration plate 30. When the vibration plate 30 is a metallic plate, however, the upper surface of the vibration plate 30 needs to be electrically insulative, for example, by forming an insulation material layer on the upper surface of the vibration plate 30 on which the common electrode 34 is to be formed. When the vibration plate 30 is made of silicon material, the upper surface of the vibration plate 30 may be electrically insulative by being oxidized. When the vibration plate 30 is made of an insulation material such as ceramic material or synthetic resin, the common electrode 34 is formed directly on the upper surface of the vibration plate 30.

Fourth Modified Embodiment

Figure 10:
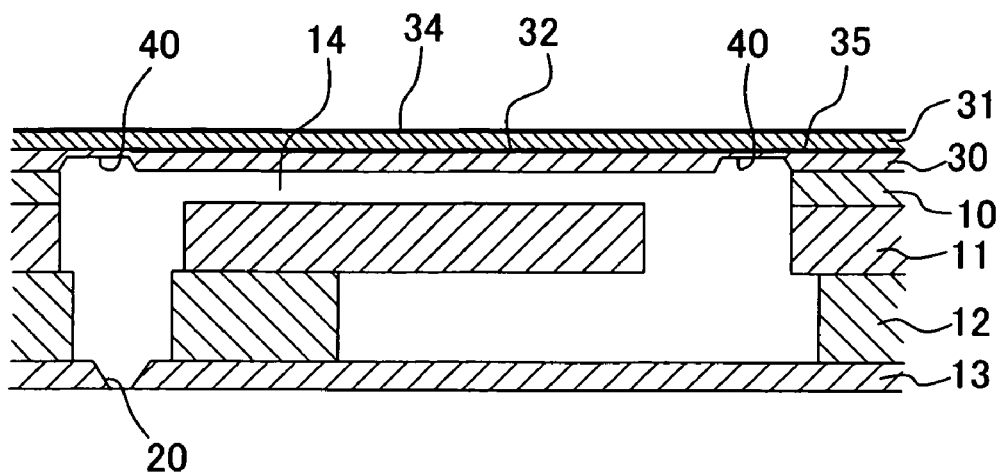
FIG. 10 is a diagram showing a fourth modified embodiment of the first embodiment corresponding to FIG. 4.

In a fourth modified embodiment, as shown in FIG. 10, the individual electrodes 32 and the wirings 35 may be arranged on the upper surface of the vibration plate 30 (the lower side of the piezoelectric layer 31), and a common electrode 34 may be arranged on the upper surface of the piezoelectric layer 31. When the vibration plate 30 is made of an electrically conducting metallic material, its upper surface, on which the individual electrodes 32 are to be formed, needs to be electrically insulative, for example, by forming an insulation material layer on the upper surface of the vibration plate 30. When the vibration plate 30 is made of silicon material or the like, its upper surface may be electrically insulative by being oxidized. When the vibration plate 30 is made of an insulation material such as ceramic material or synthetic resin, the individual electrodes 32 and the wirings 35 are formed directly on the upper surface of the vibration plate 30.

In this embodiment, as is the case with the first embodiment, grooves 40 are formed on the lower surface (surface on the side of the pressure chambers 14) of the vibration plate 30, so that the upper surface of the vibration plate 30 is flat. This makes it easy to form the wirings 35, connected to the individual electrodes 32 respectively, on the upper surface of the vibration plate 30 so that each of the wirings 35 extends outward straddling one of the grooves 40.

Fifth Modified Embodiment

Figure 11:
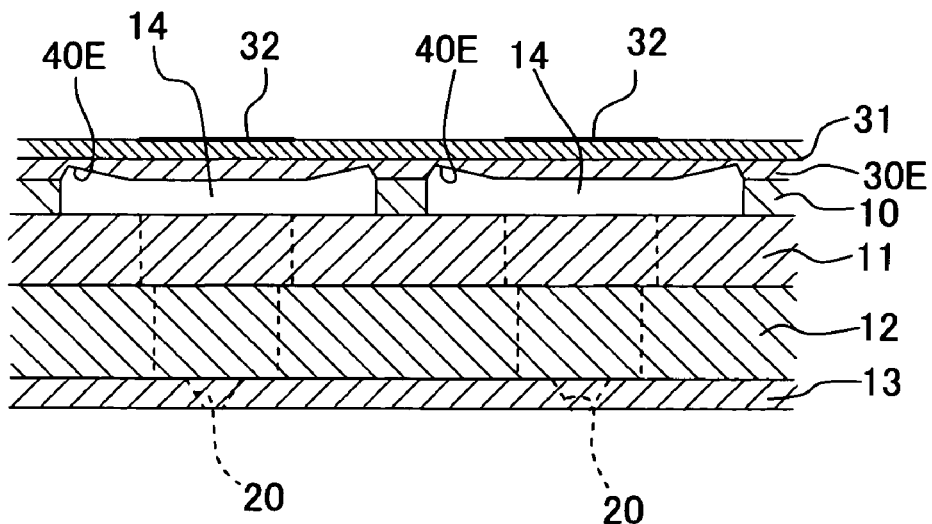
FIG. 11 is a diagram showing a fifth modified embodiment of the first embodiment corresponding to FIG. 5.

In a fifth modified embodiment, as shown in FIG. 11, a vibration plate 30E may have grooves 40E, each of which is formed to be deeper toward the edge of one of the pressure chambers 14. In this case, the vibration plate 30E is thinnest in the vicinity of its portions joined to the channel unit 2 (cavity plate 10). These portions of the vibration plate 30E are weak in constraining force and resemble to be a free end. This makes it easier for the vibration plate 30E to deform, so that the driving efficiency of the piezoelectric actuator is higher. The grooves 40E, which are shaped as shown in FIG. 11, can be formed by various methods. For example, when the vibration plate 30E is made of a synthetic resin such as polyimide, the grooves 40E can be formed by means of laser processing. In this case, a periphery of the portions of the vibration plate 30E, each of which covers one of the pressure chambers 14, is irradiated by a laser for a longer time toward the edge portion of one of the pressure chambers 14, so that the groove 40E corresponding to the portions respectively, can be deeper toward the edge of the pressure chamber 14.

Sixth Modified Embodiment

Figure 12:
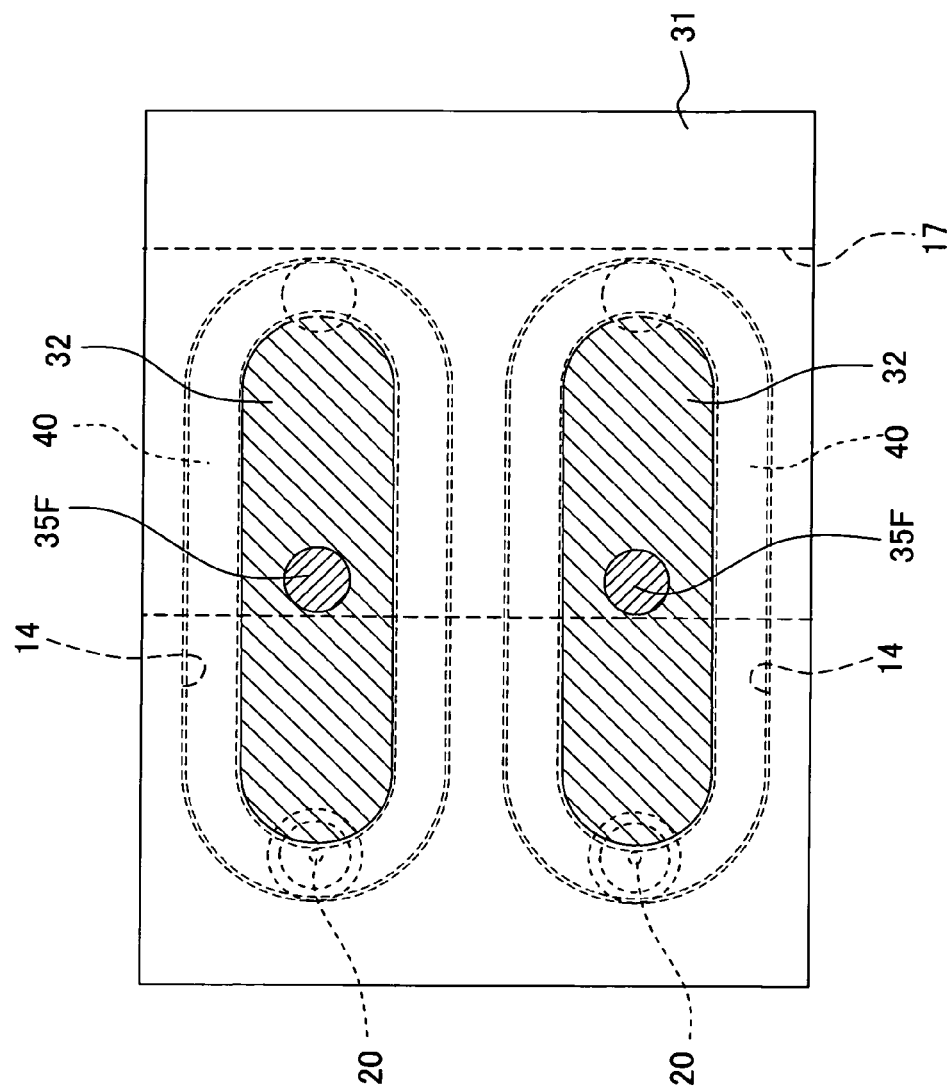
FIG. 12 is a diagram showing a sixth modified embodiment of the first embodiment corresponding to FIG. 3.

It is not necessarily indispensable that each of the wirings 35, connected to one of the individual electrodes 32, extends up to the area outside of one of the pressure chambers 14. In a sixth modified embodiment, as shown in FIG. 12 for example, each of the individual electrodes 32 may have a terminal 35F formed on its upper surface in place of the wiring 35. The terminals 35F of the individual electrodes 32 are connected to the wiring member such as FPC.

Seventh Modified Embodiment

Figure 13:
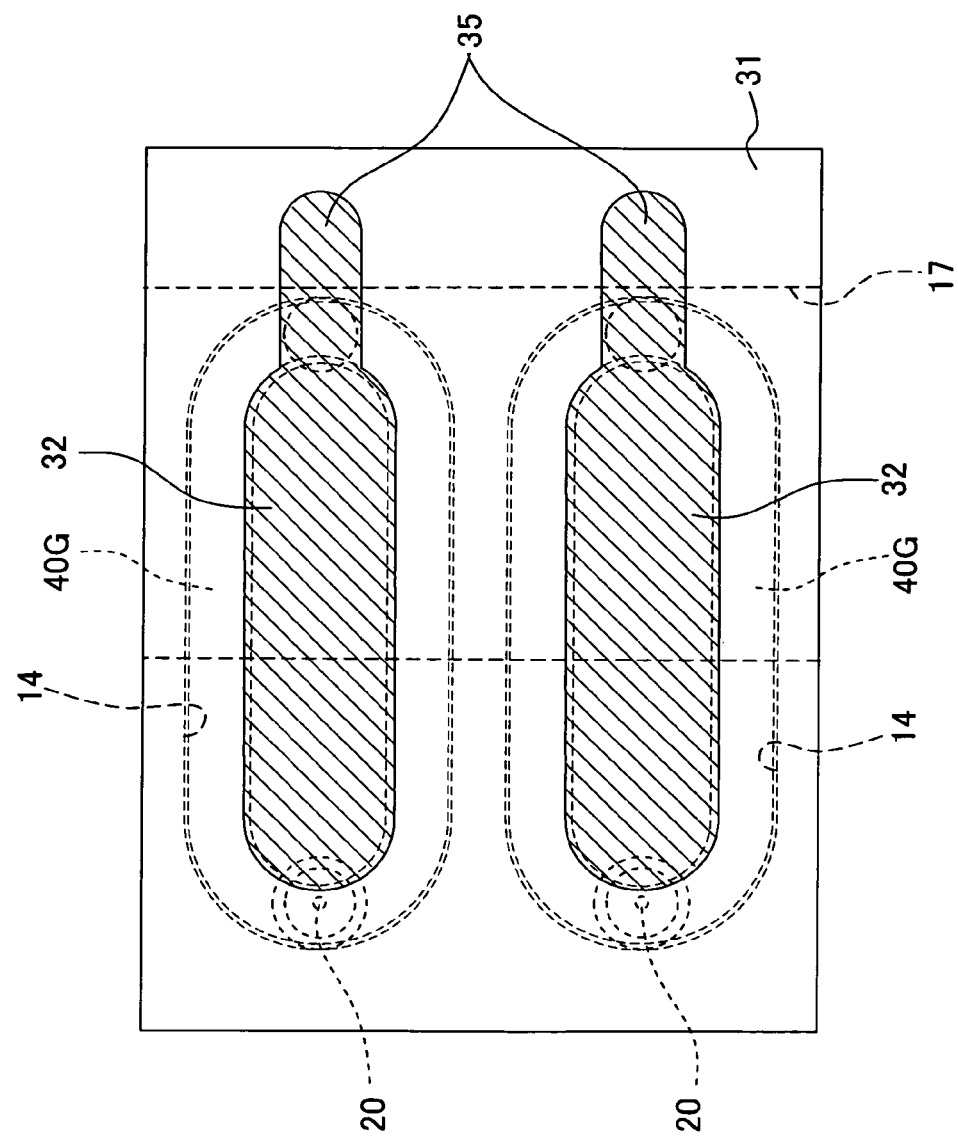
FIG. 13 is a diagram showing a seventh modified embodiment of the first embodiment corresponding to FIG. 3.

In a seventh modified embodiment, as shown in FIG. 13, grooves 40G may extend not only along the edge of the pressure chambers 14 respectively, but also extend up to areas each of which overlaps with one of the individual electrodes 32 (one of the driving portions of the piezoelectric layer 31).

Eighth Modified Embodiment

In the first embodiment, each of the grooves 40 formed on the lower surface of the vibration plate 30 has a shape of seamless circle extending along the edge of one of the pressure chambers 14 (see FIG. 3). In an eighth modified embodiment, each of the groove may be partially divided. In this case, the rigidity of the areas of the vibration plate 30, each of which overlaps with both ends in the longitudinal direction of one of the pressure chambers 14, does not strongly influence the driving efficiency of the piezoelectric actuator 3 in comparison with the rigidity of the areas of the vibration plate 30 each of which overlaps with both ends in the width direction (short direction) of one of the pressure chambers 14. Accordingly, when each of the grooves is partially divided, each of the grooves are divided preferably at an area of the vibration plate 30, the area overlapping with the both ends in the longitudinal direction (ink inlet portion 14a and ink outlet portion 14b) of one of the pressure chambers 14, which does not strongly influence the efficiency of the piezoelectric actuator 3.

Ninth Modified Embodiment

Figure 14:
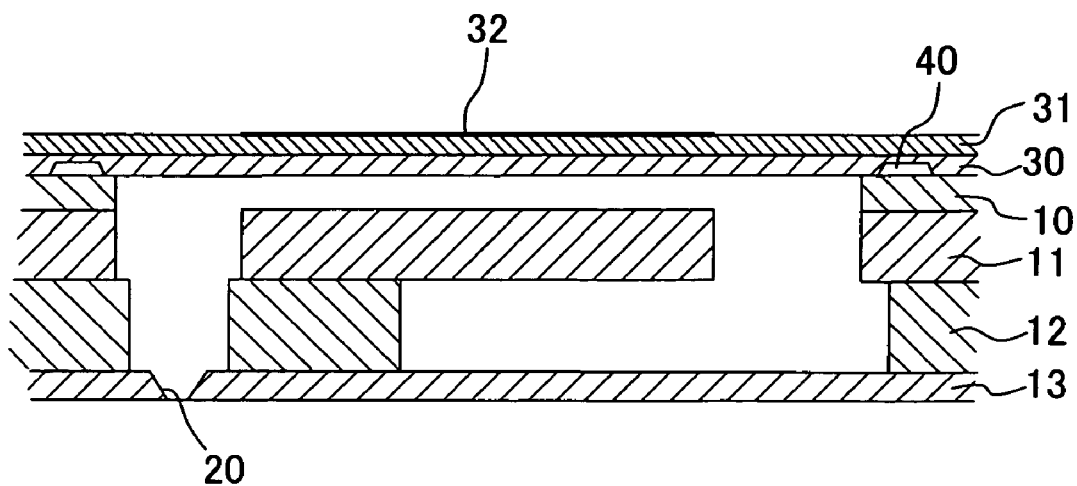
FIG. 14 is a diagram showing a ninth modified embodiment of the first embodiment corresponding to FIG. 4.

In a ninth embodiment, as shown in FIG. 14, the grooves 40 formed in the lower surface of the vibration plate 30, may be formed at portions of the vibration plate 30, each of the portion being outside of the portion overlapping with one of the pressure chambers 14, namely at portions each of which overlapping with the cavity plate 10. In this case, it is possible to reduce crosstalk, without lowering the mechanical strength of the vibration plate 30.

Next, a second embodiment of the present invention will be provided. Elements or components of the second embodiment having the same configuration as those of the foregoing first embodiment are given the same reference numerals and the descriptions therefore are omitted as appropriate.

As shown in FIGS. 15 to 18, an ink-jet head 51 as a second embodiment of the present invention includes a channel unit 52 and a piezoelectric actuator 53 arranged on the upper surface of the channel unit 2. The channel unit 52 has individual ink channels formed therein, each of which includes a pressure chamber 64.

Figure 16:
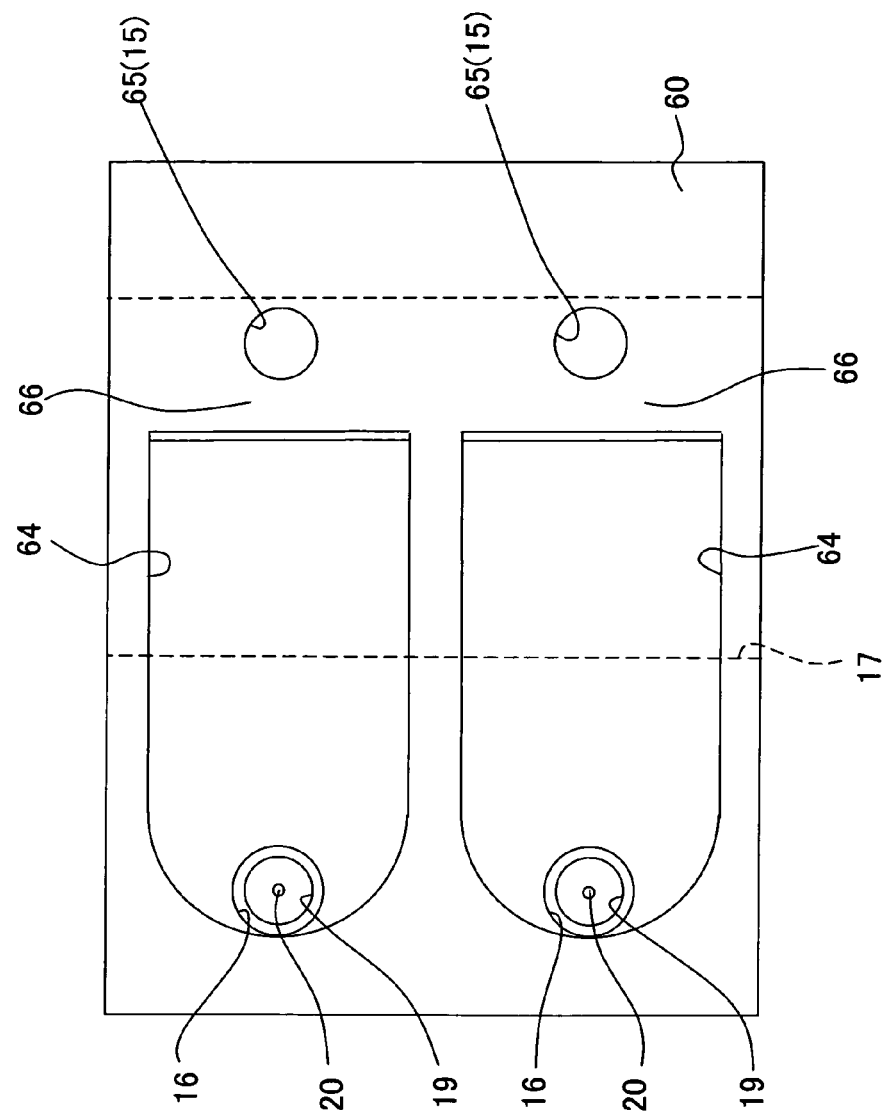
FIG. 16 is an enlarged plan view of a portion of the channel unit of the ink-jet head shown in FIG. 15.
Figure 18:
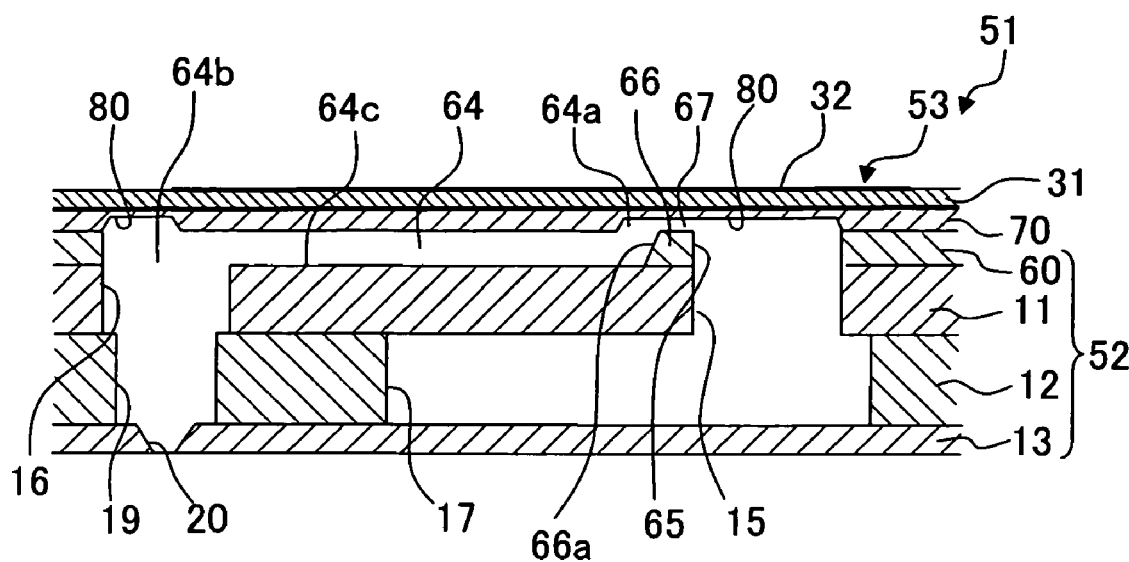
FIG. 18 is a sectional view taken on line XVIII-XVIII in FIG. 15.

As shown in FIGS. 16 and 18, the channel unit 52 includes a cavity plate 60, a base plate 11, a manifold plate 12 and a nozzle plate 13, which are bonded together in the form of a laminate. Among these four plates, the base plate 11, manifold plate 12 and nozzle plate 13 are similar to the counterparts in the first embodiment and explanation therefor will be omitted.

The cavity plate 60 has a plurality of pressure chambers 64 formed therethrough and arrayed along a plane. In plan view, each of the pressure chambers 64 is formed to be roughly elliptic (the shape of the pressure chambers 14 of the first embodiment), except that its one end in the longitudinal direction (the right end in FIG. 16) is removed. The cavity plate 60 also has circular communication holes 65 formed therethrough. Each of the communication holes 65 is formed at rightward position in FIG. 16 than one of the pressure chambers 64 shown in FIG. 16 and each of the communication holes 65 is overlapped in a plan view with one of the communication holes 15 of the base plate 11. The pressure chambers 64 and the communication holes (through holes) 65 associated thereto respectively are partitioned off by partition wall portions 66 each of which is located between each of the pressure chambers 14 and the associates communication hole (through hole) 65 thereto. As shown in FIG. 18, each of the partition wall portions 66 has a side surface 66a which faces one of the pressure chambers 64. The side surface 66a is formed to be inclined toward the ink outlet port 64b as the side surface 66a is away from a vibration plate 70. In other words, the side surface 66a is an inclined surface inclined at a degree exceeding 90 degrees (for example, 120 degrees) with respect to a bottom surface 64c of the pressure chamber 64 (surface facing) the vibration plate 70).

Further, as shown in FIG. 18, each of the pressure chambers 64 has an ink inlet port 64a formed between its right end and the vibration plate 70, which will be described later on. A throttle passage 67 is formed between each of the partition walls 66 and the vibration plate 70 and connects each of the pressure chambers 64 and one of the communication holes 65. Each of the pressure chambers 64 also has a circular ink outlet 64b which overlaps in a plan view with one of the communication holes 16 of the base plate 11. Thus, as shown in FIG. 18, the manifold 17 communicates, via the communication holes 15 and 65, throttle passages 67 and ink inlet ports 64a with the pressure chambers 64, and the pressure chambers 64 communicates, via the ink outlet ports 64b and communication holes 16 and 19, with the nozzles 20 respectively.

Figure 15:
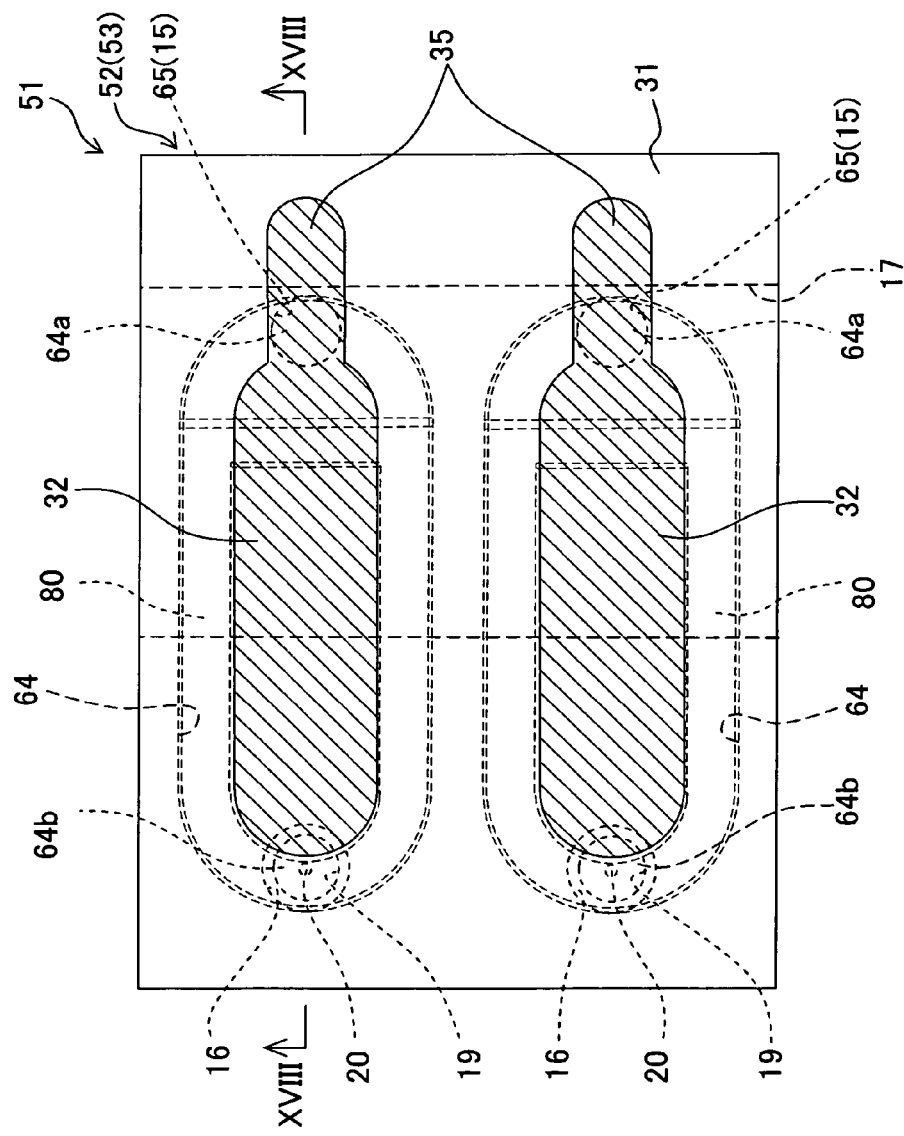
FIG. 15 is a partially enlarged plan view of an ink-jet head according to a second embodiment of the present invention.
Figure 17:
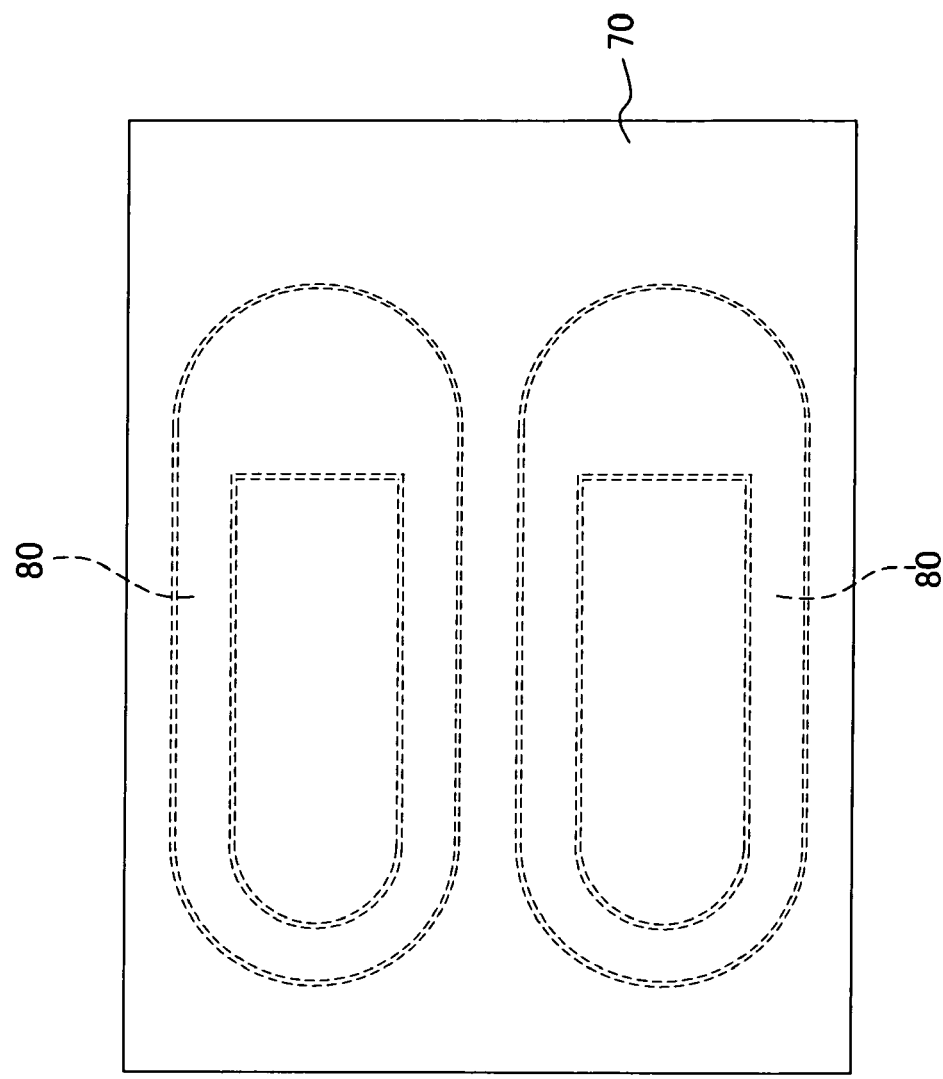
FIG. 17 is a partially enlarged plan view of the vibration plate of the ink-jet head shown in FIG. 15.

As shown in FIGS. 15, 17 and 18, the piezoelectric actuator 53 includes a vibration plate 70, a piezoelectric layer 31 and a plurality of individual electrodes 32. The vibration plate 30 is arranged on the upper surface of the channel unit 52. The piezoelectric layer 31 is formed on the upper surface (surface opposite to the pressure chambers 64) of the vibration plate 70. The individual electrodes 32 are formed on the upper surface of the piezoelectric layer 31, each of which corresponding to one of the pressure chambers 64. The piezoelectric layer 31 and individual electrodes 32 are similar to the counterparts in the foregoing first embodiment and description therefor will be omitted.

The vibration plate 70 is joined to the cavity plate 60 to cover the pressure chambers 64. The vibration plate 70 has grooves 80 formed in the shape of seamless circle on its lower surface (surface facing) the pressure chambers 64). Each of the grooves 80 is formed to extend, in a plan view, along the inside of the edge of one of the pressure chambers 64 and at the outside of an area overlapping with one of the individual electrodes 32. Accordingly, the vibration plate 70 is easily deformed at the portions in which the grooves 80 are formed, thereby improving the driving efficiency of the piezoelectric actuator 53 and also suppressing the crosstalk.

Each of the grooves 80, formed in the lower surface of the vibration plate 70, extends in a roughly semicircular form in plan view to the rightward direction in FIGS. 17 and 18 so as to cover even one of the communication holes 65 disposed outside of one of the pressure chambers 64. As shown in FIG. 18, each of the ink inlet ports 64a is formed between an end portion of one of the pressure chambers 64 and a portion, of the vibration plate, formed with the groove 80. Further, as shown in FIG. 18, each of the throttle passages 67 is formed between the upper surface of the partition wall 66 and the portion of the vibration plate 70 formed with the groove 80. Here, the height of the throttle passage 67 is equal to the depth of the groove 80. Accordingly, the sectional area of the throttle passage 67 is sufficiently narrower between the pressure chamber 64 and the manifold 17 as compared with the ink inlet port 64a and the communication holes 65, 15. Thus, each of the throttle passages 67 impedes the propagation of the pressure waves generated in the associated pressure chamber 64 to the manifold 17.

The sectional area of the throttle passages 67 influences the propagation of pressure waves in the pressure chamber 64, and consequently, strongly influences the ink discharge characteristics such as the volume of the ink droplets discharged through the nozzles 20 and the velocity at which the droplets are discharged through the nozzles 20. Accordingly, it is necessary to form the throttle passages 67 with considerable precision. In the ink-jet head 51 of the second embodiment, however, each of the throttle passages 67 is formed between the upper surface of the cavity plate 60 (channel unit 52) and the portion the groove 80 formed in the lower surface of the vibration plate 70. Accordingly, only by forming the grooves 80 with precision in the vibration plate 70, it is possible to form the throttle passage 67 at the same time. This simplifies the process for manufacturing the ink-jet head 51 and improves the manufacturing yield, in comparison with a case where throttle passages 67 are formed by half etching separately from the grooves 80. The side surface 66a of each of the partition walls 66, which is on the side of the pressure chamber 64, is an inclined surface forming an angle greater than 90 degrees with the bottom surface 64c of one of the pressure chambers 64. This enables ink to flow from each throttle passage 67 into the associated pressure chamber 64 smoothly without causing the ink to stagnate, in comparison with a case where the side surface 66a is a surface perpendicular to the bottom surface 64c. Consequently, air bubbles are prevented from remaining in the corner formed by the bottom surface 64c of the pressure chamber 64 and the side surface 66a of the partition wall 66, so that ink can be ejected more stably.

Figure 19A:
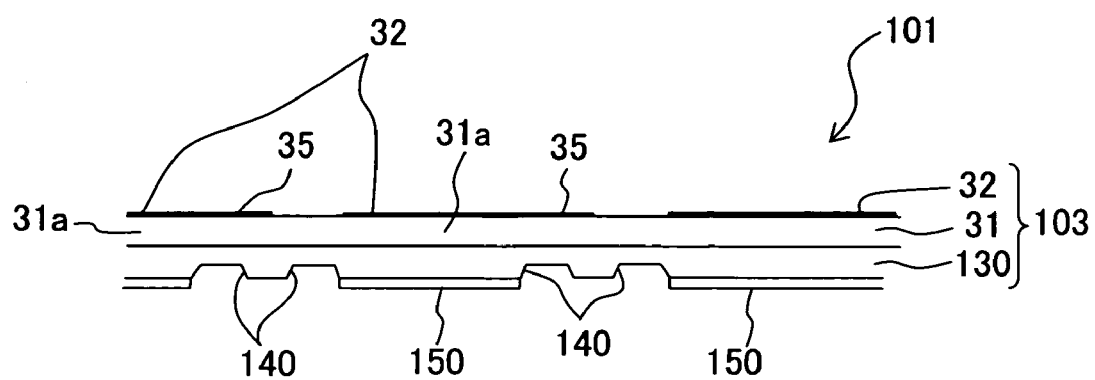
FIGS. 19A and 19B are schematic sectional views of multi-mirrors according to a third embodiment of the present invention.

Next, as a third embodiment of the present invention, a movable multi-mirror including the piezoelectric actuator according to the present invention will be described. Elements or components of the third embodiment having the same configuration as those of the above-described embodiments are given the same reference numerals and the descriptions therefor are omitted as appropriate. As shown in FIG. 19A, a movable multi-mirror 101 includes a piezoelectric actuator 103 and a plurality of mirrors 150. The piezoelectric actuator 103 includes a piezoelectric layer 31, a plurality of individual electrodes 32 and an electrically conductive vibration plate 130. The individual electrodes 32 are provided on one surface of the piezoelectric layer 31, and the vibration plate 130 is provided on the other surface of the piezoelectric layer 31 to sandwich the piezoelectric layer 31 therebetween. Each of the individual electrodes 32 is rectangular in shape and has a terminal 35 at one end in the longitudinal direction thereof. The individual electrodes 32 are connected, via the terminals 35 respectively, to a driver IC (not shown) by a wiring means such as FPC. The vibration plate 130 is kept at ground potential via the driver IC. Grooves 140 are formed, corresponding to the individual electrodes 32 respectively, on the surface of the vibration plate opposite to the piezoelectric layer 31. Each of the grooves 140 is formed at the outside of an area which overlaps in a plan view with one of the individual electrodes 32. Each of the grooves 140 has a rectangular shape in a plan view which surrounds the outer periphery of one of the individual electrodes 32, along the edge of one of the individual electrodes. In addition, mirror 150 are provided, on the surface of the vibration plate 130 in which the grooves 140 are formed, at the inside of the areas surrounded by the grooves 140 respectively, in other words, the mirrors 150 are provided at areas each of which overlaps in a plan view with one of the individual electrodes By applying a predetermined voltage between one or more of the desired individual electrodes 32 and the vibration plate 130 via the driver IC (not shown), it is possible to deform only the driving portion or portions 31a of the piezoelectric layer 31 corresponding to the desired individual electrode or electrodes 32, thereby driving only the mirror or mirrors 150 corresponding to the desired individual electrode or electrodes 32. With the grooves 140, which are formed in the vibration plate 130, it is possible to reduce the crosstalk caused when the mirrors 150 are driven and to lower the power consumed to drive the mirrors. The movable multi-mirror 101 of this embodiment may, for example, be used as a reflecting mirror which can adjust the amount of reflected light and the direction of reflection. In this case, by individually driving the mirrors 150, it is possible to adjust the directions in which each of the mirrors reflects the light. The direction adjustment makes it possible to either concentrate the reflected light in a narrow area or disperse the light in a wide area. This makes it possible to adjust the amount of reflected light for illuminating an area. Alternatively, the movable multi-mirror 101 of this embodiment may be used as elements for displaying characters or images. By driving one or more of the desired mirrors 150 to change the direction of refraction of the light, it is possible to cause characters or images to appear on a plane onto which the light reflected by the mirror surfaces or the mirrors is projected.

In this embodiment, the vibration plate 130 functions as the common electrode. Alternatively, a common electrode may be provided separately from the vibration plate. In this case, the common electrode and the vibration plate can be insulated electrically from each other by providing an insulation layer between the common electrode and vibration plate. In this case, it is also possible to arrange the individual electrodes on the side of the vibration plate to sandwich the piezoelectric layer between the vibration plate and individual electrodes, as is the case with the fourth modified embodiment of the first embodiment. In this embodiment, the individual electrodes 32 and mirrors 150 corresponding thereto respectively may be arbitrary in size, shape and number.

Figure 19B:
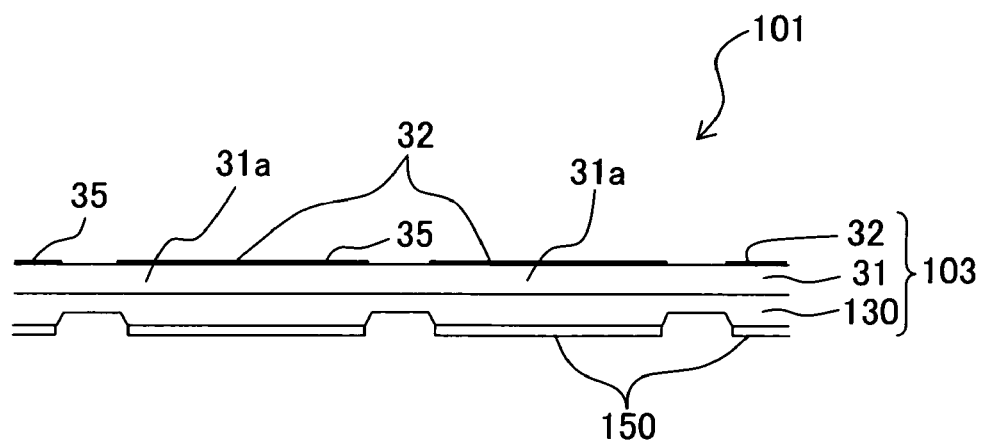

In the foregoing embodiments and the modified embodiments, each of the grooves is not limited to a shape extending along the edge of one of the pressure chambers or one of the individual electrodes, but may be arbitrary in shape. For example, each of the grooves needs not be uniform in width. The sectional shape of each of the grooves need not be limited to that in the foregoing embodiments and modified embodiments, but may be arbitrary. For example, each of the grooves may take a shape with steps, a semicircle shape or an arch in section. In the third embodiment, as shown in FIG. 19B, the grooves may be formed such that areas, of the vibration plate 130, other than the areas overlapping in a plan view with the individual electrodes 32 respectively, all become recess or concave portion.

The piezoelectric actuator and liquid transporting apparatus according to the present invention have been described hereinbefore as exemplified by the first and second embodiments in which the piezoelectric actuator and the liquid transporting apparatus of this invention are applied to an ink-jet head, and exemplified by the third embodiment in which the actuator of this invention is applied to a movable multi-mirror. However, the embodiments to which the present invention can be applied are not limited to these embodiments. For example, the liquid transporting apparatus according to the present invention is also applicable to various kinds of apparatuses for transporting liquids other than ink. The piezoelectric actuator according to the present invention is not limited to actuators for applying pressure to liquid, and is applicable to other actuators for various purposes such as vibrators for generating ultrasonic waves.

What is claimed is:

1. A liquid transporting apparatus comprising:
  a channel unit having a plurality of pressure chambers arranged along a plane; and
  a piezoelectric actuator which is arranged on a surface of the channel unit and which changes volume of the pressure chambers to apply pressure to liquid in the pressure chambers;
  wherein the piezoelectric actuator includes a vibration plate which covers the pressure chambers and which has a first surface opposite to the pressure chambers wherein the first surface opposite to the pressure chambers is smooth, a piezoelectric layer arranged continuously in a direction parallel to the plane on the first surface of the vibration plate, a plurality of individual electrodes each of which is arranged at an area overlapping with a central portion of one of the pressure chambers as viewed in a direction perpendicular to the plane, and a common electrode which sandwiches the piezoelectric layer between the individual electrodes and the common electrode; and wherein grooves are formed on a second surface of the vibration plate facing the pressure chambers, each of the grooves being formed at an area which is outside of an area which overlaps with both of one of the individual electrodes and the common electrode as viewed in the direction perpendicular to the plane.

2. The liquid transporting apparatus according to claim 1, wherein each of the grooves is disposed inside of an edge of one of the pressure chambers and is formed along the edge of one of the pressure chambers as viewed in the direction perpendicular to the plane.

3. The liquid transporting apparatus according to claim 2, wherein each of the grooves has a circular shape; and wirings, connected to the individual electrodes respectively, extend up to areas each of which is outside of one of the grooves, as viewed in the direction perpendicular to the plane, each of the wirings extending straddling one of the grooves.

4. The liquid transporting apparatus according to claim 3, wherein each of the grooves is formed to have a shape of seamless circle.

5. The liquid transporting apparatus according to claim 4, wherein the vibration plate has a first metallic material layer and a second metallic material layer which are formed of mutually different metallic materials and are stacked in a laminated state; the second metallic material layer is arranged in the channel unit to cover the pressure chambers; and through holes are formed in a surface of the second metallic material layer, the surface being on a side of the pressure chambers, each of the through holes extending along the edge of one of the pressure chambers and being formed to have the shape of seamless circle, and each of the through holes of the second metallic layer material is closed by the first metallic material layer to form each of the grooves.

6. The liquid transporting apparatus according to claim 5, wherein the second metallic material layer is formed of a metallic material etchable by a predetermined etching solution; and the first metallic material layer is formed of a metallic material unetchable by the predetermined etching solution.

7. The liquid transporting apparatus according to claim 2, wherein each of the grooves is formed to be deeper toward the edge of one of the pressure chambers.

8. The liquid transporting apparatus according to claim 2, wherein each of the grooves has a cross section which is tapered to be wider toward one of the pressure chambers.

9. The liquid transporting apparatus according to claim 2, wherein the channel unit has a common liquid chamber communicating with the pressure chambers; a throttle passage is formed between the one surface of the channel unit and a portion of one of the grooves formed on the vibration plate, a sectional area of the throttle passage being partially narrowed between the common liquid chamber and one of the pressure chambers.

10. A liquid transporting apparatus comprising:
a channel unit having a plurality of pressure chambers arranged along a plane; and
a piezoelectric actuator which is arranged on one surface of the channel unit and which changes volume of the pressure chambers to apply pressure to liquid in the pressure chambers;
wherein the piezoelectric actuator includes a vibration plate which covers the pressure chambers, a piezoelectric layer arranged on a side of the vibration plate opposite to the pressure chambers, a plurality of individual electrodes each of which is arranged at an area overlapping with a central portion of one of the pressure chambers as viewed in a direction perpendicular to the plane, and a common electrode which sandwiches the piezoelectric layer between the individual electrodes and the common electrode;
wherein grooves are formed on a surface of the vibration plate on a side of the pressure chambers, each of the grooves being formed at an area which is outside of an area which overlaps with both of one of the individual electrodes and the common electrode as viewed in the direction perpendicular to the plane;
wherein each of the grooves is disposed inside of an edge of one of the pressure chambers and is formed along the edge of one of the pressure chambers as viewed in the direction perpendicular to the plane;
wherein the channel unit has a common liquid chamber communicating with the pressure Chambers; a throttle passage is formed between the one surface of the channel unit and a portion of one of the grooves formed on the vibration plate, a sectional area of the throttle passage being partially narrowed between the common liquid chamber and one of the pressure chambers; and
wherein the channel unit is formed of a plurality of laminated plates in which a channel including the pressure chambers is formed; one of the plates is formed with the pressure chambers, a plurality of through holes which are to be at least a part of channels each of which communicates the common liquid chamber and one of the pressure chambers, and partition walls each of which partitions one of the pressure chambers and one of the through holes; a surface of each of the partition walls faces the portion of one of the grooves to form the throttle passage therebetween, the surface being on a side of the vibration plate; and a side surface of each of the partition walls, the side surface facing one of the pressure chambers, is inclined at an angle exceeding 90 degrees with respect to a surface of one of the pressure chambers facing the vibration plate.

* * * * *